(12) United States Patent
Leobandung

(10) Patent No.: US 11,024,636 B1
(45) Date of Patent: Jun. 1, 2021

(54) VERTICAL 3D STACK NOR DEVICE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 22 days.

(21) Appl. No.: 16/681,491

(22) Filed: Nov. 12, 2019

(51) Int. Cl.
| | |
|---|---|
| H01L 27/11556 | (2017.01) |
| H01L 27/11521 | (2017.01) |
| H01L 27/11526 | (2017.01) |
| H01L 29/04 | (2006.01) |
| H01L 29/16 | (2006.01) |
| H01L 21/28 | (2006.01) |
| H01L 23/522 | (2006.01) |
| H01L 21/768 | (2006.01) |
| H01L 23/528 | (2006.01) |

(Continued)

(52) U.S. Cl.
CPC .. *H01L 27/11556* (2013.01); *H01L 21/76805* (2013.01); *H01L 21/76816* (2013.01); *H01L 21/76877* (2013.01); *H01L 21/76895* (2013.01); *H01L 23/5226* (2013.01); *H01L 23/5283* (2013.01); *H01L 23/535* (2013.01); *H01L 27/11521* (2013.01); *H01L 27/11526* (2013.01); *H01L 29/04* (2013.01); *H01L 29/16* (2013.01); *H01L 29/40114* (2019.08); *H01L 29/42324* (2013.01)

(58) Field of Classification Search
CPC ......... H01L 27/11524; H01L 27/11529; H01L 27/11551–11556; H01L 27/11578–11582; H01L 29/42324; H01L 23/5283; H01L 29/7883
See application file for complete search history.

(56) References Cited

U.S. PATENT DOCUMENTS

| | | |
|---|---|---|
| 8,598,032 B2 | 12/2013 | Chen et al. |
| 8,630,114 B2 | 1/2014 | Lue |

(Continued)

OTHER PUBLICATIONS

Disclosed Anonymously "New NOR type recess Floating Gate Non-Volatile memory cell" IPCOM000256024D, Oct. 30, 2018 (4 pages).

(Continued)

*Primary Examiner* — Nelson Garces
(74) *Attorney, Agent, or Firm* — Randall Bluestone; Michael J. Chang, LLC

(57) ABSTRACT

The present invention provides 3D stack NOR devices having increased storage area. In one aspect, a method of forming a memory device includes: forming a memory stack on a wafer having alternating sacrificial word and bit line layers separated by dielectric layers; patterning a channel hole in the stack; recessing the sacrificial word line layers to form divots along opposite sides of the channel hole; selectively forming a floating gate stack in the divots; filling the channel hole and divots to form a channel; patterning the memory stack into a stair case structure; burying the memory stack in a dielectric; replacing the sacrificial word line layers in the memory stack with word line contacts; and replacing the sacrificial bit line layers in the memory stack with bit line contacts. A memory device is also provided.

20 Claims, 16 Drawing Sheets

(51) Int. Cl.
    *H01L 23/535*    (2006.01)
    *H01L 29/423*    (2006.01)

(56) References Cited

U.S. PATENT DOCUMENTS

| | | |
|---|---|---|
| 9,589,978 B1 | 3/2017 | Yip |
| 9,831,257 B2 | 11/2017 | Lue |
| 10,026,746 B2 | 7/2018 | Lee et al. |
| 10,121,796 B2 | 11/2018 | Sonehara et al. |
| 2014/0231954 A1 | 8/2014 | Lue |
| 2018/0006381 A1* | 1/2018 | Hong ............... B32B 15/20 |
| 2018/0040623 A1 | 2/2018 | Kanakamedala et al. |
| 2019/0043868 A1 | 2/2019 | Hasnat et al. |
| 2019/0333931 A1* | 10/2019 | Jung ............... H01L 23/528 |

OTHER PUBLICATIONS

Fick et al., "Analog Computation in Flash Memory for Datacenter-scale AI Inference in a Small Chip," Hot Chip, Aug. 2018 (28 pages).

* cited by examiner

VERTICAL 3D STACK NOR DEVICE

FIELD OF THE INVENTION

The present invention relates to memory devices, and more particularly, to vertical three-dimensional (3D) stack NOR devices having increased storage area.

BACKGROUND OF THE INVENTION

With stacked or three-dimensional (3D) NAND architecture, floating gate memory devices are stacked vertically in layers, one on top of the other. Employing a 3D NAND architecture advantageously reduces the footprint of the device, while increasing efficiency and reducing costs when compared to its planar or two-dimensional (2D) counterpart.

However, there are many circuit applications using floating gate memory that require a NOR configuration. One such application requiring a NOR configuration is a neural network circuit.

Unfortunately, to date the processes that have been proposed for stacking NOR devices are expensive. Thus, these processes are not practical for implementation in mass production.

Thus, techniques for efficiently and effectively forming a 3D stack NOR device for applications such as neural networking would be desirable.

SUMMARY OF THE INVENTION

The present invention provides three-dimensional (3D) stack NOR devices having increased storage area. In one aspect of the invention, a method of forming a memory device is provided. The method includes: forming a memory stack on a wafer, wherein the memory stack includes alternating sacrificial word line layers and sacrificial bit line layers separated by dielectric layers; patterning a channel hole in the memory stack; recessing the sacrificial word line layers through the channel hole to form divots in the sacrificial word line layers along opposite sides of the channel hole; selectively forming a floating gate stack in the divots; filling the channel hole and the divots with a channel material to form a channel; patterning the memory stack into a stair case structure having a largest footprint at a base of the memory stack which narrows progressively at each level up the stair case structure; burying the memory stack in a dielectric; replacing the sacrificial word line layers in the memory stack with word line contacts; and replacing the sacrificial bit line layers in the memory stack with bit line contacts.

In another aspect of the invention, another method of forming a memory device is provided. The method includes: forming a memory stack on a wafer, wherein the memory stack includes alternating sacrificial word line layers and sacrificial bit line layers separated by dielectric layers; patterning a channel hole in the memory stack; recessing the sacrificial word line layers through the channel hole to form divots in the sacrificial word line layers along opposite sides of the channel hole; selectively forming a floating gate stack in the divots; filling the channel hole and the divots with a channel material to form a channel; patterning the memory stack into a stair case structure having a largest footprint at a base of the memory stack which narrows progressively at each level up the stair case structure; burying the memory stack in a dielectric; patterning first contact holes in the dielectric over each of the sacrificial word line layers; removing the sacrificial word line layers via the first contact holes forming first gaps in the memory stack; forming word line contacts in the first contact holes and the first gaps; patterning second contact holes in the dielectric over each of the sacrificial bit line layers; removing the sacrificial bit line layers via the second contact holes forming second gaps in the memory stack; and forming bit line contacts in the second contact holes and the second gaps.

In yet another aspect of the invention, a memory device is provided. The memory device includes: a wafer; a memory stack disposed on the wafer, wherein the memory stack includes alternating word line contacts and bit line contacts separated by dielectric layers, and wherein the memory stack has a stair case structure having a largest footprint at a base of the memory stack which narrows progressively at each level up the stair case structure; a channel hole in the memory stack; divots in the word line contacts along opposite sides of the channel hole; a floating gate stack lining the divots; a channel including a channel material disposed into, and filling, the channel hole and the divots; and a dielectric surrounding the memory stack.

A more complete understanding of the present invention, as well as further features and advantages of the present invention, will be obtained by reference to the following detailed description and drawings.

DETAILED DESCRIPTION OF PREFERRED EMBODIMENTS

Provided herein are three-dimensional (3D) stack NOR device designs with increased storage area, which can be employed in applications such as neural networking. A NOR device is a semiconductor logic device with transistors that collectively serve as a logical gate for performing logic operations on logical values. In the case of a NOR gate, the NOR logic operation produces a value of TRUE if and only if the logical values are False. As will be described in detail below, the present NOR device includes 3D stack floating gate transistors. A floating gate transistor has both a floating gate and a control gate. The floating gate is located between the control gate and a channel of the transistor. While the control gate functions like that of a standard transistor, the floating gate is surrounded by dielectrics. For instance, a gate oxide separates the floating gate from the control gate, and a tunnel oxide separates the floating gate from the channel. In the present NOR device design, the channel is oriented vertically at the center of the 3D stack, and both bit line and word line contacts are made to the sides of the floating gate transistors.

Figure 1:
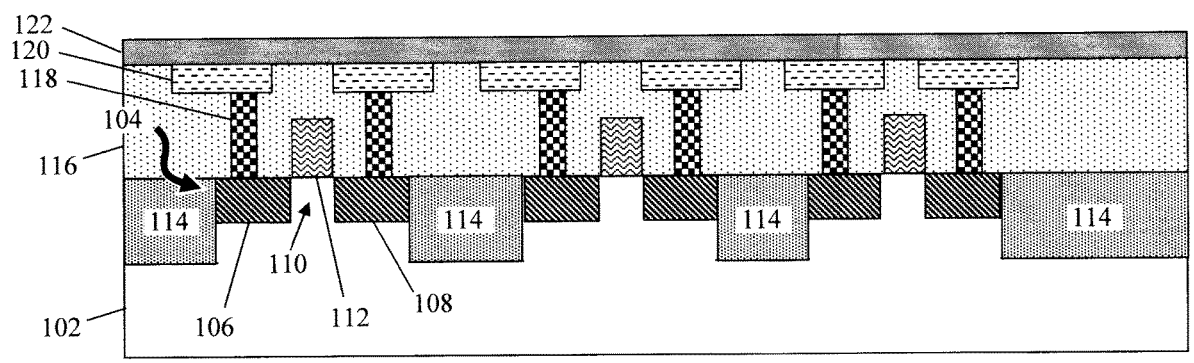
FIG. 1 is a cross-sectional diagram illustrating a wafer having multiple field effect transistors (FETs) and a metal line formed on the wafer over the FETs according to an embodiment of the present invention.

An exemplary methodology for forming a 3D stack NOR device in accordance with the present techniques is now described by way of reference to FIGS. 1-16. As shown in FIG. 1, the process begins with a wafer 102. According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

As shown in FIG. 1, multiple field effect transistors (FETs) 104 are formed in wafer 102. Generally, FETs 104 are standard transistors each transistor including a source 106 and a drain 108 interconnected by a channel 110. A gate 112 is disposed over the channel 110 that regulates current flow through the channel 110. Source and drains 106 and 108 are doped with an n-type or p-type dopant depending on whether an n-channel FET (NFET) or a p-channel FET (PFET) is being formed. Suitable n-type dopants include, but are not limited to, phosphorous (P) and/or arsenic (As), and suitable p-type dopants include, but are not limited to, boron (B).

While not explicitly shown in the figures, it would be apparent to one skilled in the art that the gate 112 can include a stack of materials. For instance, according to an exemplary embodiment, gate 112 includes a gate dielectric (not shown) disposed on the channel 110 and a gate conductor(s) (not shown) disposed on the gate dielectric.

To isolate the FETs 104, shallow trench isolation (STI) regions 114 are present in wafer 102 in between the FETs 104. According to an exemplary embodiment, STI regions 114 include an insulator such as an oxide insulator material, often referred to as a STI oxide.

As shown in FIG. 1, FETs 114 are buried in an interlayer dielectric (ILD) 116. Suitable materials for ILD 116 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH).

Source and drain contacts 118 and metal pads 120 are present in ILD 116 interconnecting the source and drains 106 and 108 to an insulator line 122. According to an exemplary embodiment, insulator line 122 is formed from dielectric insulation. As shown in FIG. 1, insulator line 122 is in contact with each of the metal pads 120. In a subsequent step, insulator line 122 will be patterned (at the center of the stack—see below) during channel formation of the 3D stack floating gate transistors.

Figure 2:
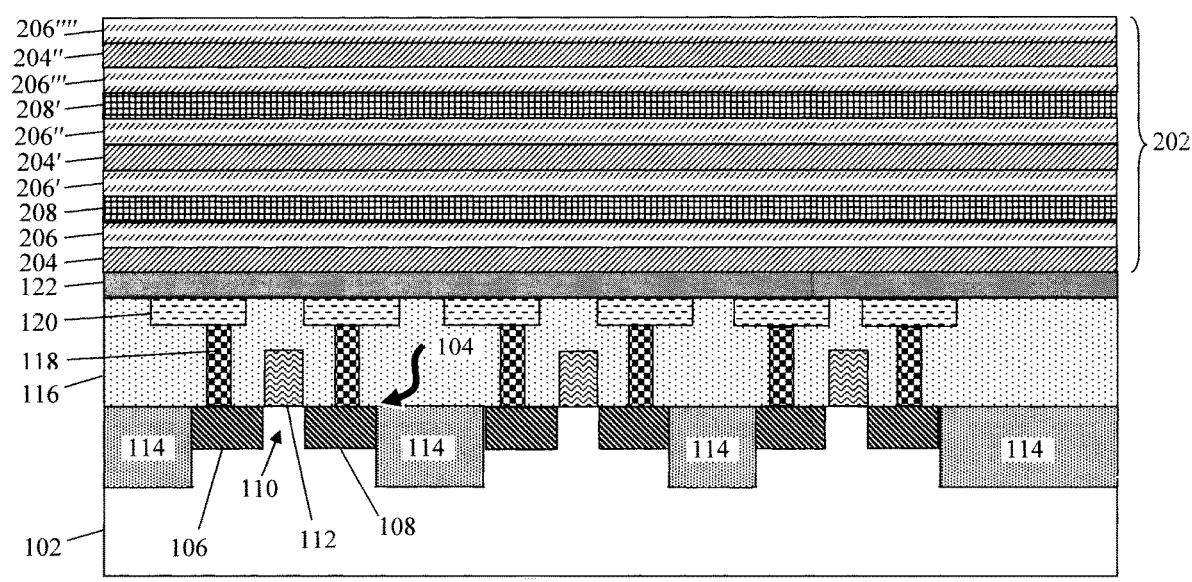
FIG. 2 is a cross-sectional diagram illustrating a memory stack having been formed on the wafer having alternating sacrificial word line and bit line layers separated by dielectric layers according to an embodiment of the present invention.

Next, as shown in FIG. 2, a memory stack 202 is formed on the wafer 102 (i.e., on insulator line 122) over FETs 104. As will be described in detail below, the memory stack 202 includes alternating sacrificial word line and bit line layers separated by a dielectric. The term "sacrificial" as used herein refers to a structure, e.g., such as a layer in the stack, placed early in the process as a placeholder that is later removed and replaced with another layer/material in the final NOR device. For instance, the sacrificial word line and bit line layers serve as placeholders for the word lines and bit lines in the stack. As will be described in detail below, these sacrificial word line and bit line layers will be selectively removed and replaced with conductive word line and bit line materials.

Specifically, the formation of memory stack 202 begins with the deposition of a (first) sacrificial word line layer 204 on the insulator line 122. Suitable materials for sacrificial word line layer 204 include, but are not limited to, materials such as amorphous carbon, silicon nitride (SiN), silicon oxynitride (SiON) and/or silicon oxycarbonitride (SiOCN). A process such as chemical vapor deposition (CVD), atomic layer deposition (ALD) or physical vapor deposition (PVD) can be used to deposit sacrificial word line layer 204 on insulator line 122. According to an exemplary embodiment, sacrificial word line layer 204 has a thickness of from about 5 nanometers (nm) to about 50 nm and ranges therebetween.

Next, a (first) dielectric layer 206 is deposited onto the sacrificial word line layer 204. Suitable materials for dielectric layer 206 include, but are not limited to, oxide dielectric materials such as SiOx and/or silicon oxycarbide (SiOC). A process such as CVD, ALD or PVD can be used to deposit dielectric layer 206 onto sacrificial word line layer 204. According to an exemplary embodiment, dielectric layer 206 has a thickness of from about 5 nm to about 20 nm and ranges therebetween.

A (first) sacrificial bit line layer 208 is then deposited onto the dielectric layer 206. Suitable materials for sacrificial bit line layer 208 include, but are not limited to, amorphous carbon, poly-silicon (poly-Si) and/or silicon carbide (SiC). A process such as CVD, ALD or PCD can be used to deposit sacrificial bit line layer 208 onto dielectric layer 206. According to an exemplary embodiment, sacrificial bit line layer 208 has a thickness of from about 5 nm to about 50 nm and ranges therebetween.

Notably, the materials employed for the sacrificial word line layer 204, dielectric layer 206, sacrificial bit line layer 208, and successive iterations of these layers to build up the memory stack 202 (see below) provide etch selectivity which will enable selective etching of the sacrificial word line and bit line layers at respective points in the process. For instance, as will be described in detail below, during formation of the floating gate an etch of the sacrificial word line layers selective to the dielectric layers and the sacrificial word line layers will be used to form divots alongside the channel in which the floating gates will be formed. Following formation of the floating gates, the sacrificial word line layers will be removed from the stack selective to the dielectric layers and replaced with the word lines of the NOR device. Similarly, the sacrificial bit line layers will be removed from the stack selective to the dielectric layers and replaced with the bit lines of the NOR device. The exemplary materials provided above for the sacrificial word line layer 204, dielectric layer 206, and sacrificial bit line layer 208 advantageously provide the needed etch selectivity.

Each sacrificial word line layer in memory stack 202 is separated from the next adjacent sacrificial bit line layer by a dielectric layer. Thus, a (second) dielectric layer 206' is next deposited onto sacrificial bit line layer 208. As above, suitable materials for dielectric layer 206' include, but are not limited to, oxide dielectric materials such as SiOx and/or SiOC deposited using a process such as CVD, ALD or PVD. According to an exemplary embodiment, dielectric layer 206' has a thickness of from about 5 nm to about 20 nm and ranges therebetween.

The above-described process is then repeated to place additional (second, third, fourth, etc.) sacrificial word line layers/dielectric layers/sacrificial bit line layers on the memory stack 202. See, for example, sacrificial word line layers 204'/204", dielectric layers 206"/206'"/206"", and sacrificial bit line layer 208'. As a result, memory stack 202 includes alternating sacrificial word line layers 204/204'/204" and sacrificial bit line layers 208/208' separated by dielectric layers 206/206"/206'"/206"".

According to an exemplary embodiment, the configuration of each of sacrificial word line layers 204'/204" is the same as that of sacrificial word line layer 204. Namely, each of sacrificial word line layers 204'/204" is formed from a material such as amorphous carbon, SiN, SiON and/or SiOCN deposited using a process such as CVD, ALD or PVD to a thickness of from about 5 nm to about 50 nm and ranges therebetween. Similarly, the configuration of each of dielectric layers 206"/206'"/206"" is the same as that of dielectric layer 206. Namely, each of dielectric layers 206"/206'"/206"" is formed from an oxide dielectric material such as SiOx and/or SiOC deposited using a process such as CVD, ALD or PVD to a thickness of from about 5 nm to about 20 nm and ranges therebetween. As well, the configuration of sacrificial bit line layer 208' is the same as that of sacrificial bit line layer 208. Namely, sacrificial bit line layer 208' is formed from a material such as, amorphous carbon, poly-Si and/or SiC deposited using a process such as CVD, ALD or PVD to a thickness of from about 5 nm to about 50 nm and ranges therebetween. Further, it is notable that the size of the memory stack 202 shown in the present figures is merely an example, and embodiments are contemplated herein where memory stack 202 includes more, or fewer, sacrificial word line and bit line layers than shown.

Figure 3:
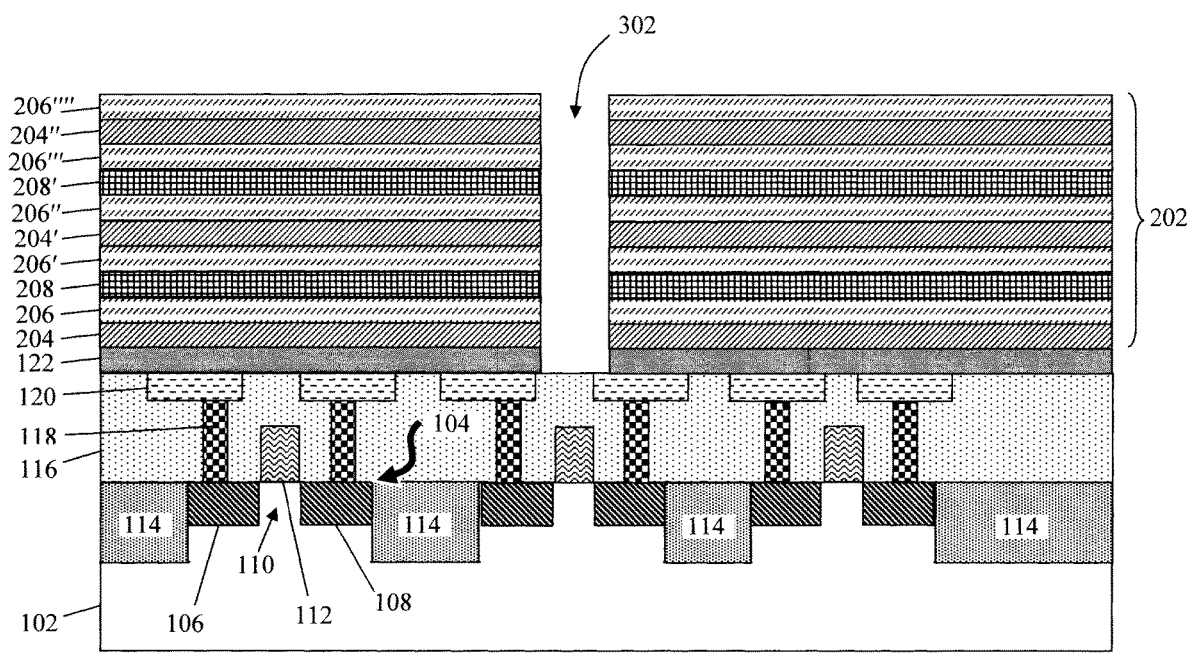
FIG. 3 is a cross-sectional diagram illustrating a channel hole having been patterned in the memory stack (e.g., at a center of the memory stack) according to an embodiment of the present invention.

Next, a channel hole 302 is patterned in the memory stack 202. See FIG. 3. As shown in FIG. 3, channel hole 302 is present at approximately the center of memory stack 202 and extends through each sacrificial word line layer 204/204'/204", dielectric layer 206/206"/206'"/206"", and sacrificial bit line layer 208/208' in the stack, as well through the insulator line 122. Standard lithography and etching techniques can be used to pattern channel hole 302 in memory stack 202. With standard lithography and etching processes, a lithographic stack (not shown), e.g., photoresist/organic planarizing layer (OPL)/anti-reflective coating (ARC), is used to pattern a hardmask (not shown). The pattern from the hardmask is then transferred to the underlying substrate (in this case memory stack 202). The hardmask is then removed. A directional (anisotropic) etching process such as reactive ion etching (RIE) can be employed for the channel hole 302 etch.

Figure 4:
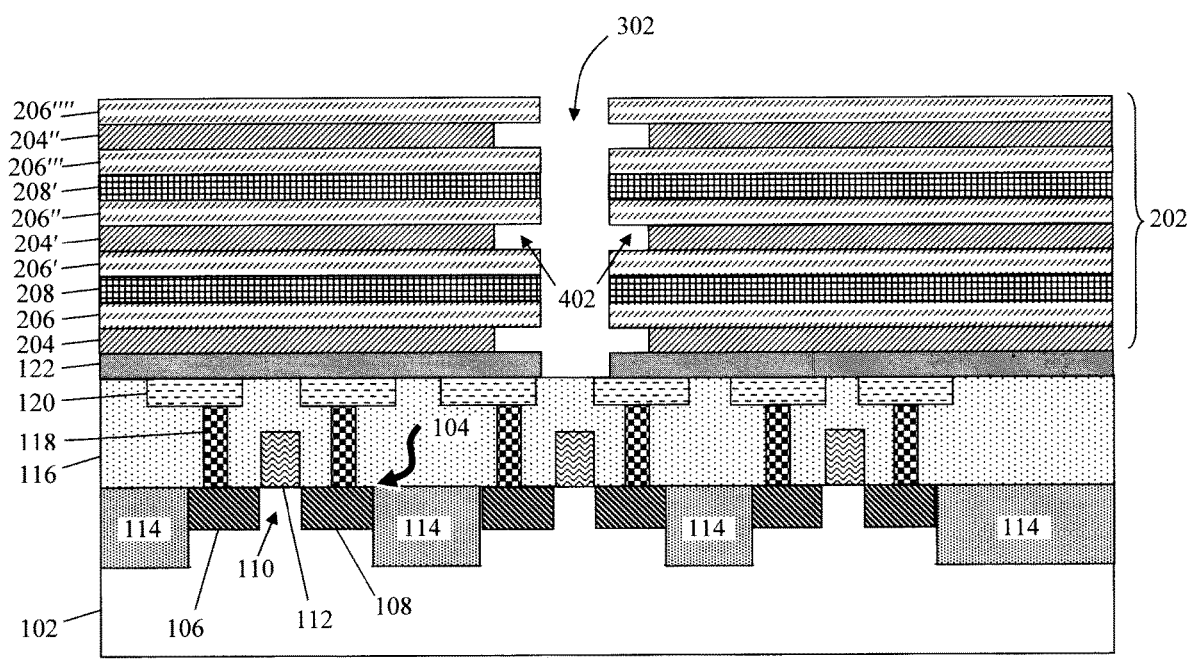
FIG. 4 is a cross-sectional diagram illustrating the sacrificial word line layers having been recessed through the channel hole to form divots in the sacrificial word line layers along opposite sides of the channel hole according to an embodiment of the present invention.

The sacrificial word line layers 204/204'/204" in memory stack 202 are then recessed. See FIG. 4. Namely, as shown in FIG. 4, a selective recess etch of the sacrificial word line layers 204/204'/204" in memory stack 202 through the channel hole 302 is performed to form divots 402 in the sacrificial word line layers 204/204'/204" along opposite sides of the channel hole 302. The divots 402 in the sacrificial word line layers 204/204'/204" along opposite sides of the channel hole 302 provide the present NOR devices with an increased storage area. As provided above, sacrificial word line layers 204/204'/204" can be formed from a nitride material such as SiN, SiON and/or SiOCN. In that case, a non-directional (i.e., isotropic), nitride-selective etching process such as a nitride-selective wet chemical or gas-phase etch can be employed to recess the sacrificial word line layers 204/204'/204" in memory stack 202 selective to dielectric layer 206/206"/206'"/206"" and sacrificial bit line layer 208/208' in memory stack 202.

Figure 5:
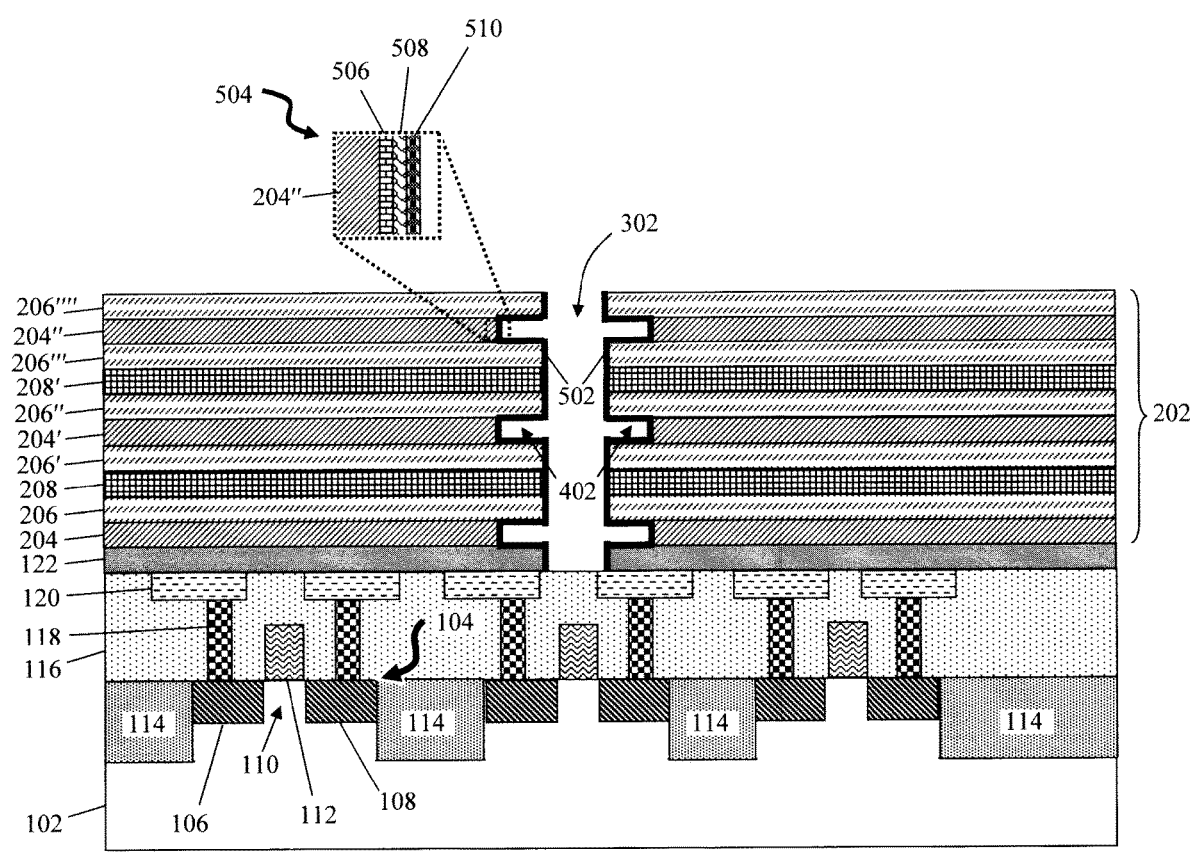
FIG. 5 is a cross-sectional diagram illustrating a floating gate stack having been formed lining the channel hole and the divots according to an embodiment of the present invention.

The formation of divots 402 in the sacrificial word line layers 204/204'/204" alongside channel hole 302 enables the selective placement of the floating gates at the ends of the sacrificial word line layers 204/204'/204". Namely, as shown in FIG. 5 a floating gate stack 502 is formed lining channel hole 302 and divots 402. As illustrated in magnified view 504, floating gate stack 502 includes a conformal gate oxide 506 disposed in the channel hole and divots 402 (i.e., on the sacrificial word line layers 204/204'/204"), a conformal floating gate 508 disposed on the gate oxide 506, and a conformal tunnel oxide 510 disposed on the floating gate 508.

Suitable materials for gate oxide 506 include, but are not limited to, SiOx. A process such as CVD, ALD or PVD can be employed to conformally deposit gate oxide 506 along the sidewalls of channel hole 302 and lining divots 402 (including on the recessed sacrificial word line layers 204/204'/204"). According to an exemplary embodiment, gate oxide 506 has a thickness of from about 5 angstroms (Å) to about 20 Å and ranges therebetween. Suitable materials for the floating gate 508 include, but are not limited to, poly-Si and/or or silicon nitride (SiN). A process such as CVD, ALD or PVD can be employed to conformally deposit floating gate 508 along the sidewalls of channel hole 302 and lining divots 402 over gate oxide 506. According to an exemplary embodiment, floating gate 508 has a thickness of from about 1 nm to about 3 nm and ranges therebetween. Suitable materials for the tunnel oxide 510 include, but are not limited to, SiOx. A process such as CVD, ALD or PVD can be employed to conformally deposit tunnel oxide 510 along the sidewalls of channel hole 302 and lining divots 402 over gate oxide 506/floating gate 508. According to an exemplary embodiment, tunnel oxide 510 has a thickness of from about 5 Å to about 20 Å and ranges therebetween. As will be described in detail below, the (recessed) sacrificial word line layers 204/204'/204" abutting the floating gate stack 502 in divots 402 will be removed and replaced with word lines of the NOR device. These word lines will serve as the control gate of the floating gate transistors, which is separated from floating gate 508 by gate oxide 506. In turn, the floating gate 508 is separated from the channel (to be formed in channel hole 302 (see below) by tunnel oxide 510.

Figure 6:
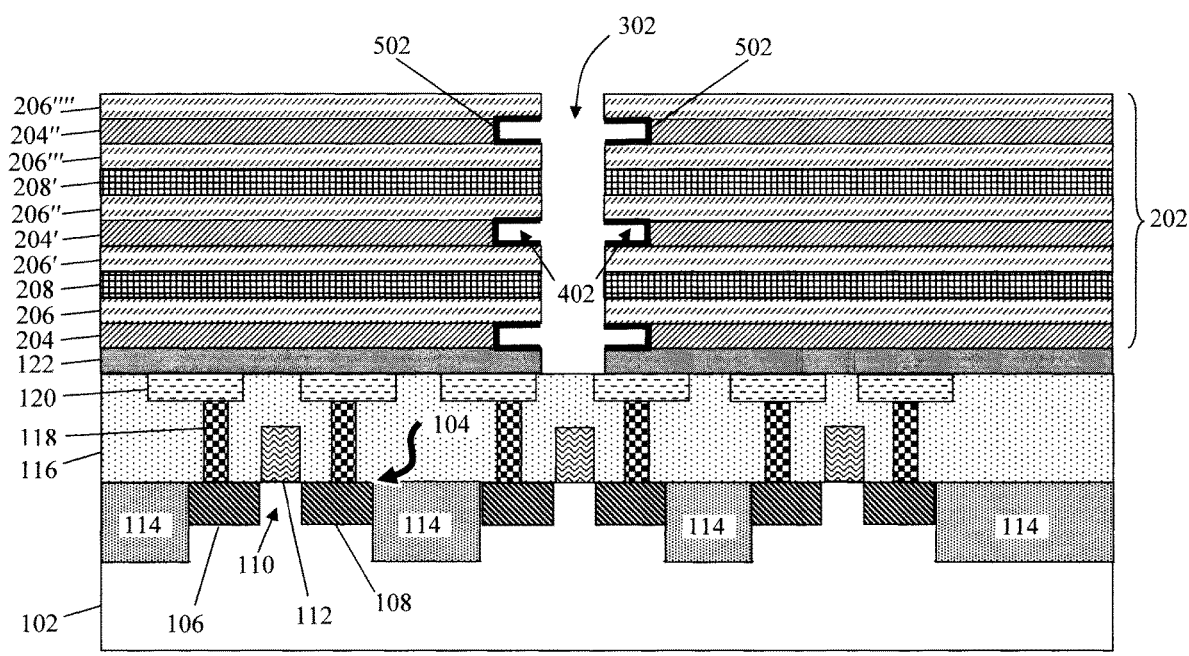
FIG. 6 is a cross-sectional diagram illustrating an etchback of the floating gate stack having been performed to remove the floating gate stack from the sidewalls of the channel hole such that only the floating gate stack lining the divots remains according to an embodiment of the present invention.
Figure 7:
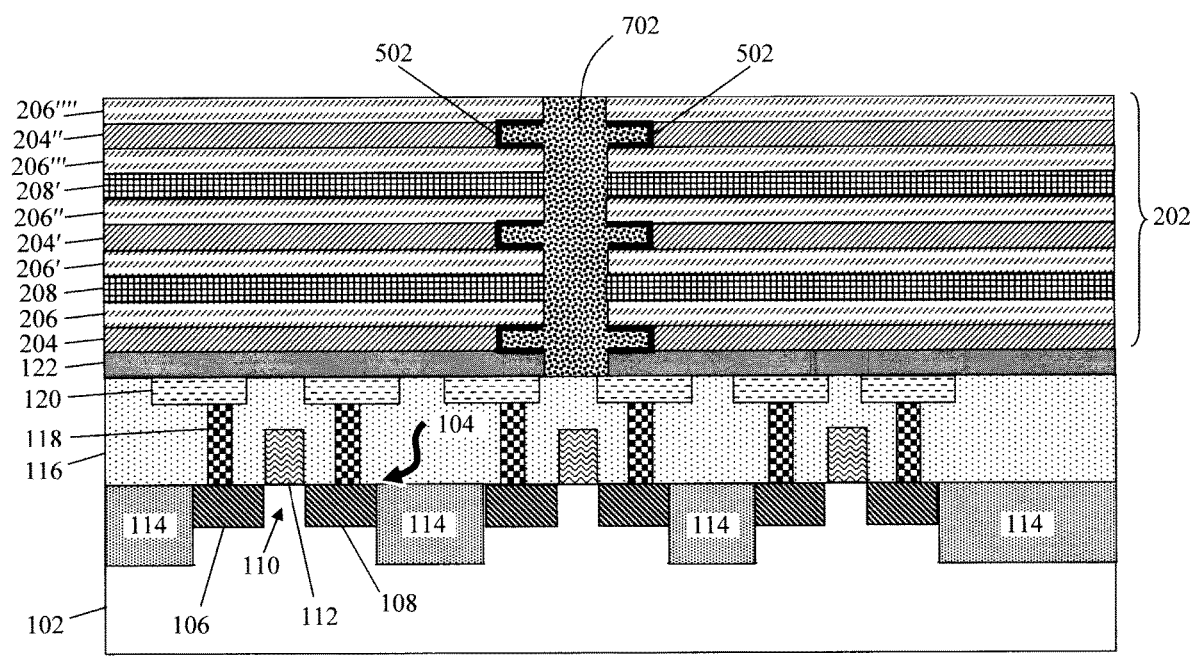
FIG. 7 is a cross-sectional diagram illustrating the channel hole and the divots having been filled with a channel material to form a channel at the center of the memory stack according to an embodiment of the present invention.

As shown in FIG. 6, an etch-back of the floating gate stack 502 (i.e., gate oxide 506/floating gate 508/tunnel oxide 510) is then performed to remove floating gate stack 502 from the sidewalls and bottom of channel hole 302. Following the etch-back, only the floating gate stack 502 lining the divots 402 remains. According to an exemplary embodiment, a directional (anisotropic) etching process such as RIE is employed for the etch-back of floating gate stack 502. As provided above, formation of the floating gate in this manner enables the selective placement of the floating gate stack 502 at the ends of the sacrificial word line layers 204/2047204".

Next, the channel hole 302 and divots 402 are filled with a channel material to form channel 702 at the center of memory stack 202. See FIG. 7. Following deposition, the channel material is planarized using a process such as chemical-mechanical polishing (CMP). Suitable channel materials include, but are not limited to, poly-Si. The channel material can be deposited using a process such as CVD, ALD or PVD.

The memory stack 202 is then patterned into a stair case structure having a largest footprint at a base of the memory stack 202 and narrowing progressively each 'level' up the stair case. See FIG. 8. The stair case structure is patterned such that at each 'level' of the stair case structure, a select one of the sacrificial word line layers 204/204'/204" or sacrificial bit line layers 208/208' can be accessed. For instance, as will be described in detail below, the 'step' at the base of the memory stack 202 provides access to the bottommost sacrificial word line layer 204 in the memory stack 202. The next step up the memory stack 202 provides access to the bottommost sacrificial bit line layer 208 in the memory stack 202, and so on.

Each level of the stair case design includes a patterned portion of the immediately underlying dielectric layer and corresponding sacrificial word line or bit line layer on top of the dielectric layer. Moving forward, the patterned portions of each layer will be given the designation 'a', e.g., sacrificial word line layer 204 as patterned is given the reference numeral 204a, dielectric layer 206 as patterned is given the reference numeral 206a, sacrificial bit line layer 208 as patterned is given the reference numeral 208a, and so on.

Figure 8:
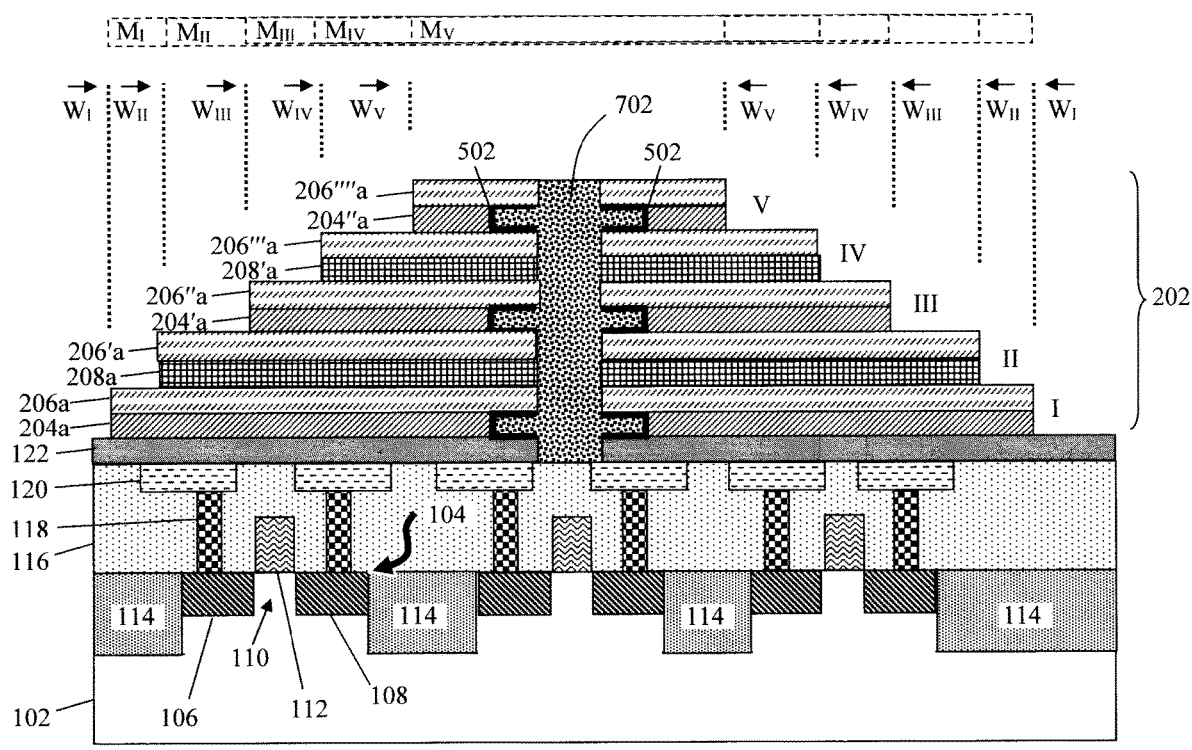
FIG. 8 is a cross-sectional diagram illustrating the memory stack having been patterned into a stair case structure according to an embodiment of the present invention.

As shown in FIG. 8, following patterning, a level I of memory stack 202 (with the stair case design) includes sacrificial word line layer 204a and dielectric layer 206a and has a width $W_I$, a level II of memory stack 202 includes sacrificial bit line layer 208a and dielectric layer 206'a and has a width $W_{II}$, a level III of memory stack 202 includes sacrificial word line layer 204'a and dielectric layer 206"a and has a width Wm, a level IV of memory stack 202 includes sacrificial bit line layer 208'a and dielectric layer 206'''a and has a width $W_{IV}$, and a level V of memory stack 202 includes sacrificial word line layer 204"a and dielectric layer 206""a and has a width $W_V$. As highlighted above, the largest footprint is now at the base of memory stack 202 and which narrows progressively with each level up the stack, i.e., $W_I > W_{II} > W_{III} > W_{IV} > W_V$.

Standard lithography and etching techniques can be employed to pattern memory stack 202 into the stair case design shown in FIG. 8. For instance, according to an exemplary embodiment, in a first etch step, a lithography mask $M_I$ is used to pattern the memory stack 202 with the footprint and location of level I. The lithography mask is then shrunk from $M_I \rightarrow M_{II}$. In a second etch step, lithography mask $M_{II}$ is used to pattern the memory stack 202 (above level I) with the footprint and location of level II. The lithography mask is then shrunk from $M_{II} \rightarrow M_{III}$. In a third etch step, lithography mask $M_{III}$ is used to pattern the memory stack 202 (above level I and II) with the footprint and location of level III. The lithography mask is then shrunk from $M_{III} \rightarrow M_{IV}$. In a fourth etch step, lithography mask $M_{IV}$ is used to pattern the memory stack 202 (above level I, II and III) with the footprint and location of level IV. The lithography mask is then shrunk from $M_{IV} \rightarrow M_V$. In a fifth etch step, lithography mask $M_V$ is used to pattern the memory stack 202 (above level I, II, III and IV) with the footprint and location of level V. Depending on the height of memory stack 202, this patterning process can be repeated as necessary to complete the stair case design throughout the stack.

Notably, this stair case design selectively uncovers the respective sacrificial word line layer or sacrificial bit line layer at each level. For instance, at level I opposite ends of sacrificial word line layer 204a (beneath dielectric layer 206a) are now uncovered by the overlying sacrificial bit line layer, at level II opposite ends of sacrificial bit line layer 208a (beneath dielectric layer 206'a) are now uncovered by the overlying sacrificial word line layer, at level III opposite ends of sacrificial word line layer 204'a (beneath dielectric layer 206"a) are now uncovered by the overlying sacrificial word line layer, at level IV opposite ends of sacrificial bit line layer 208'a (beneath dielectric layer 206'''a) are now uncovered by the overlying sacrificial word line layer, and at level V sacrificial word line layer 204"a is present at the top of memory stack 202 and is present beneath dielectric layer 206""a.

The memory stack 202 with the stair case design is then buried/surrounded in a dielectric 902. See FIG. 9. Suitable dielectrics include, but are not limited to, oxide materials such as SiOx and/or SiCOH and/or ULK-ILD materials such as pSiCOH. A process such as CVD, ALD or PVD can be used to deposit dielectric 902. Following deposition, the dielectric 902 is planarized using a process such as CMP.

Figure 9:
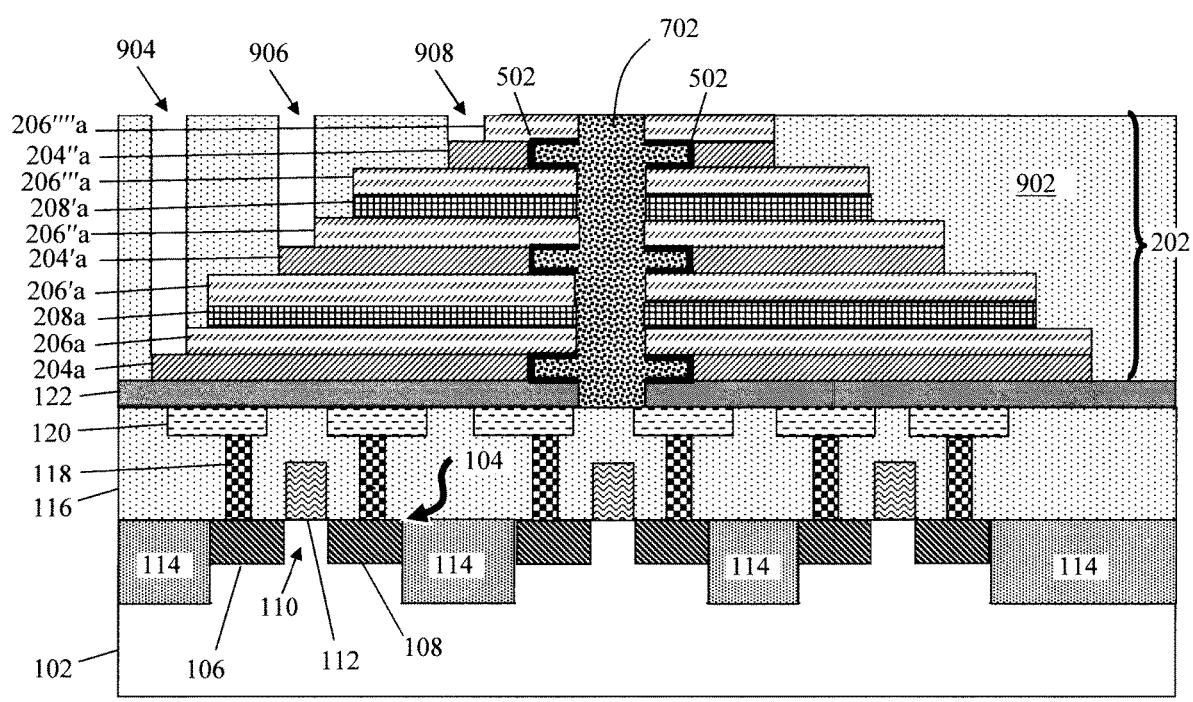
FIG. 9 is a cross-sectional diagram illustrating the memory stack having been buried/surrounded in a dielectric, and (first) contact holes having been patterned in the dielectric over the sacrificial word line layers according to an embodiment of the present invention.

The sacrificial word line layers are then removed and replaced with word line contacts. Namely, contact holes are first patterned in dielectric 902 over each of the sacrificial word line layers 204a/204'a/204"a. Specifically, as shown in FIG. 9, contact holes 904, 906 and 908 are patterned in dielectric 902 over sacrificial word line layers 204a, 204'a and 204"a, respectively. Each contact hole 904, 906 and 908 extends down through dielectric 902 and the individual dielectric layer 206a, 206"a and 206"a over each of the sacrificial word line layers 204a, 204'a and 204"a, respectively. Based on the stair case configuration of memory stack 202, each contact hole 904, 906 and 908 accesses an individual sacrificial word line layer. As shown in FIG. 9, this is accomplished by forming the contact holes 904, 906 and 908 over the ends of the respective sacrificial word line layers 204a, 204'a and 204"a (from which the overlying sacrificial word and bit line layers have been removed by the stair case patterning—see above).

Figure 10:
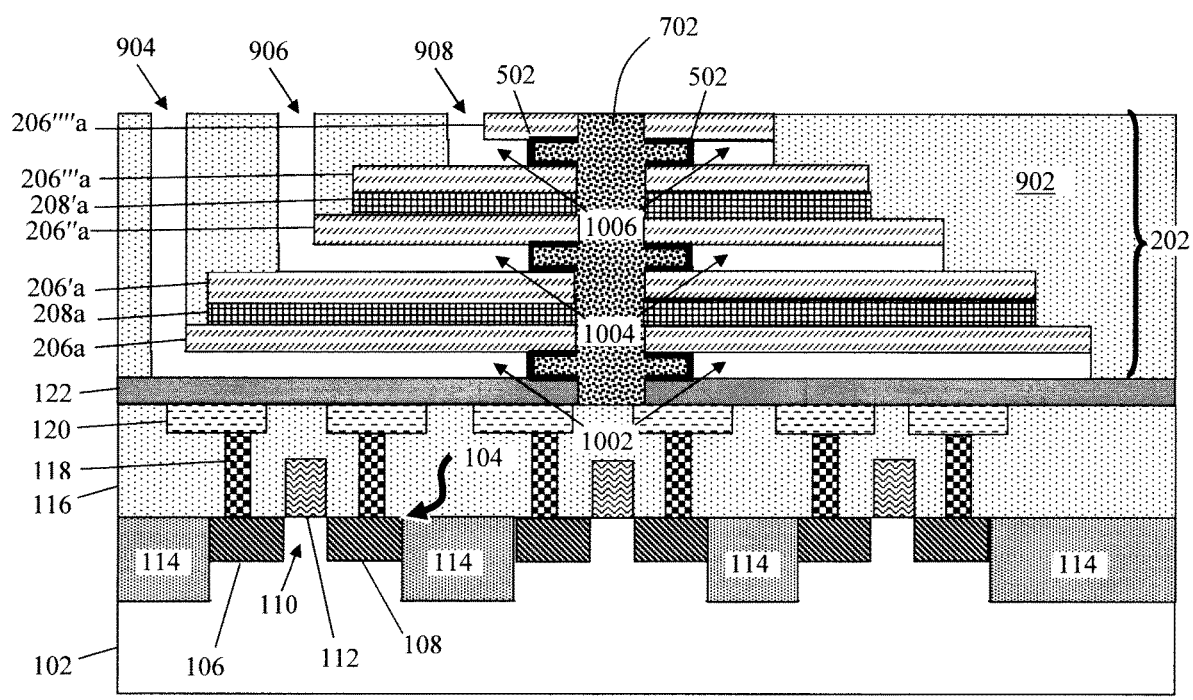
FIG. 10 is a cross-sectional diagram illustrating the sacrificial word line layers having been removed from the memory stack via the first contact holes creating (first) gaps in the memory stack according to an embodiment of the present invention.
Figure 11:
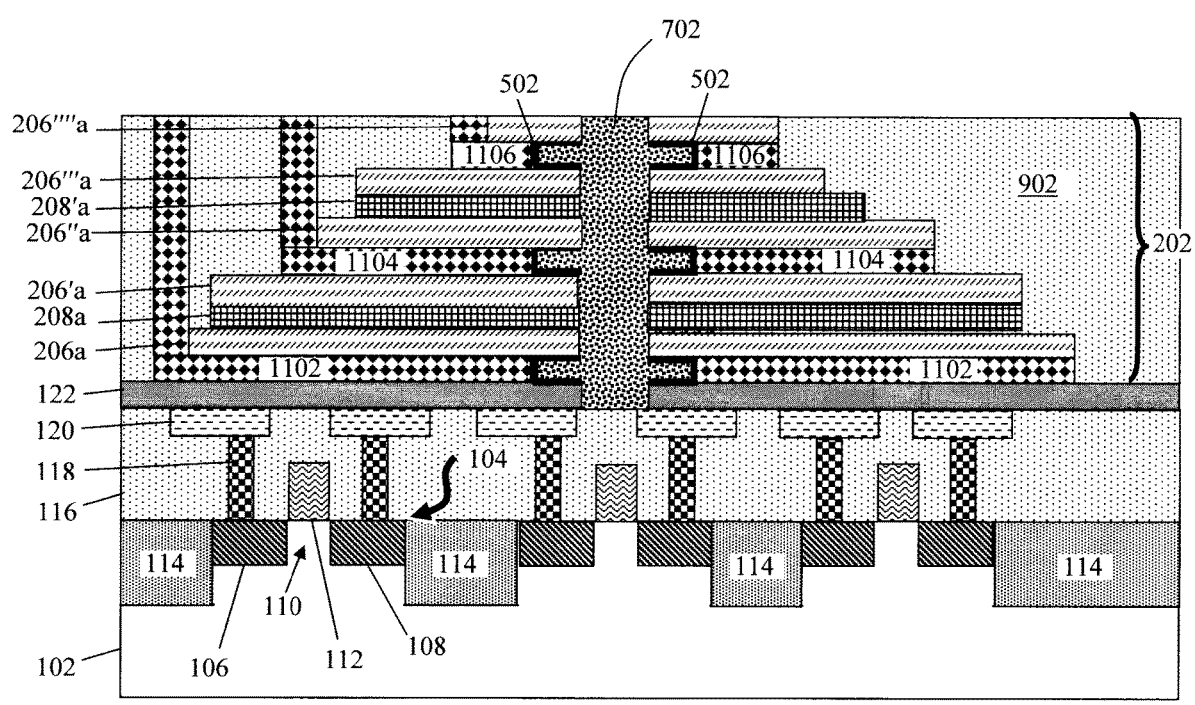
FIG. 11 is a cross-sectional diagram illustrating the first contact holes and first gaps having been filled with a contact metal(s) to form a (first) word line contact, a (second) word line contact and a (third) word line contact according to an embodiment of the present invention.

Next, sacrificial word line layers 204, 204' and 204" are removed from memory stack 202 via the contact holes 904, 906 and 908, respectively. See FIG. 10. As shown in FIG. 10, removal of sacrificial word line layers 204, 204' and 204" in this manner creates first gaps in memory stack 202. For instance, removal of sacrificial word line layer 204 creates a gap 1002 between insulator line 122 and dielectric layer 206a. Removal of sacrificial word line layer 204' creates a gap 1004 between dielectric layer 206'a and dielectric layer 206"a. Removal of sacrificial word line layer 204"a creates a gap 1006 between dielectric layer 206'"a and dielectric layer 206""a.

It is notable that the figures depict cross-sectional views through the NOR device structure. However, as described above, channel 702 is formed in a (e.g., circular) hole patterned in the memory stack 202 (see channel hole 302 above). Thus, although not visible in the figures, it should be apparent that the layers of memory stack 202 are continuous around the channel hole 302/channel 702. As such, accessing sacrificial word line layers 204a, 204'a and 204"a on one side of channel 702 (e.g., through the contact holes 904, 906 and 908) permits complete removal of these sacrificial layers from the memory stack 202 as shown in FIG. 10. According to an exemplary embodiment, an isotropic etching process (such as a wet chemical etch) is used to remove the sacrificial word line layers 204a, 204'a and 204"a through the contact holes 904, 906 and 908, respectively.

The contact holes 904, 906 and 908, and gaps 1002, 1004 and 1006 are then filled with a contact metal or combination of metals to form a (first) word line contact 1102, a (second) word line contact 1104 and a (third) word line contact 1106. See FIG. 11. Suitable contact metals include, but are not limited to, copper (Cu), tungsten (W), ruthenium (Ru), cobalt (Co), nickel (Ni) and/or platinum (Pt). The contact metal(s) can be deposited into the contact holes 904, 906 and 908, and gaps 1002, 1004 and 1006 using a process such as CVD, ALD or electrochemical plating. Prior to depositing the contact metal(s), a barrier layer (not shown) can be deposited into and lining contact holes 904, 906 and 908, and gaps 1002, 1004 and 1006 to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining contact holes 904, 906 and 908, and gaps 1002, 1004 and 1006 prior to contact metal deposition. A seed layer facilitates plating of the contact metal(s).

Figure 12:
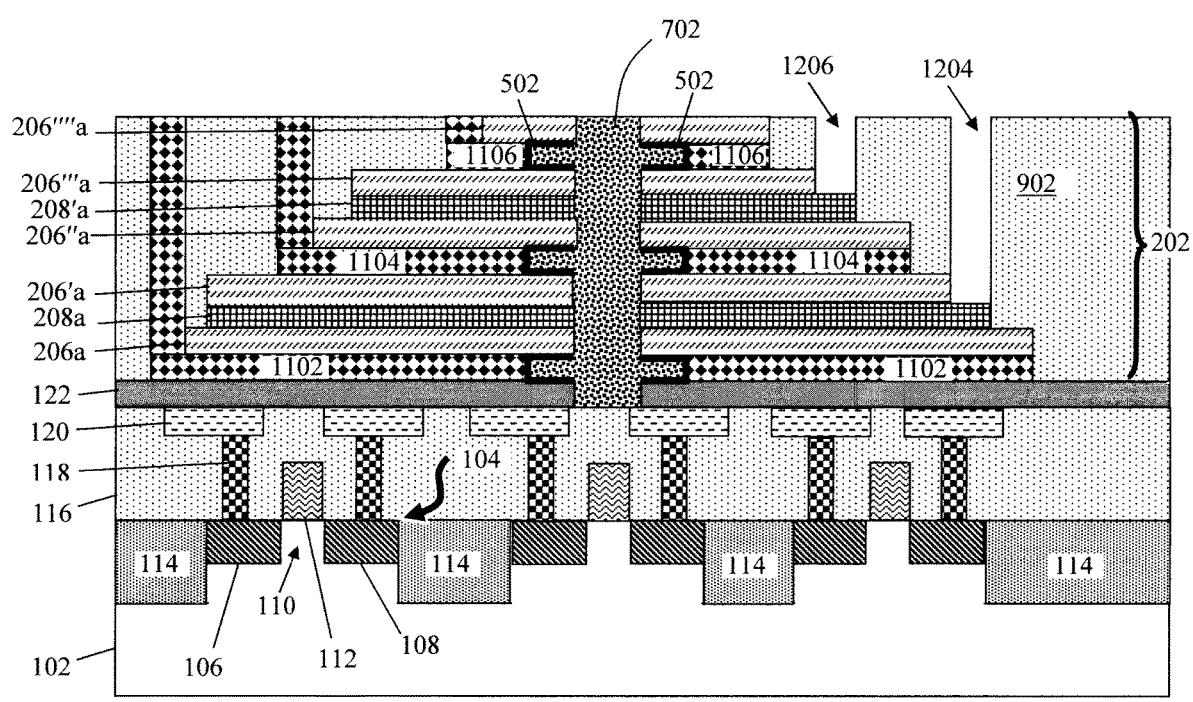
FIG. 12 is a cross-sectional diagram illustrating (second) contact holes having been patterned in the dielectric over the sacrificial bit line layers according to an embodiment of the present invention.

The process is then repeated to remove the sacrificial bit line layers from the memory stack 202 and replace them with the bit lines of the NOR device. Namely, as shown in FIG. 12, second contact holes 1204 and 1206 are patterned in dielectric 902 over sacrificial bit line layers 208a and 208'a, respectively. Each contact hole 1204 and 1206 extends down through dielectric 902 and the individual dielectric layer 206'a and 206'"a over each of the sacrificial bit line layers 208a and 208'a, respectively. Based on the stair case configuration of memory stack 202, each contact hole 1204 and 1206 accesses an individual sacrificial bit line layer. As shown in FIG. 12, this is accomplished by forming the contact holes 1204 and 1206 over the ends of the respective sacrificial bit line layers 208a and 208'a (from which the overlying sacrificial word and bit line layers have been removed by the stair case patterning—see above).

Figure 13:
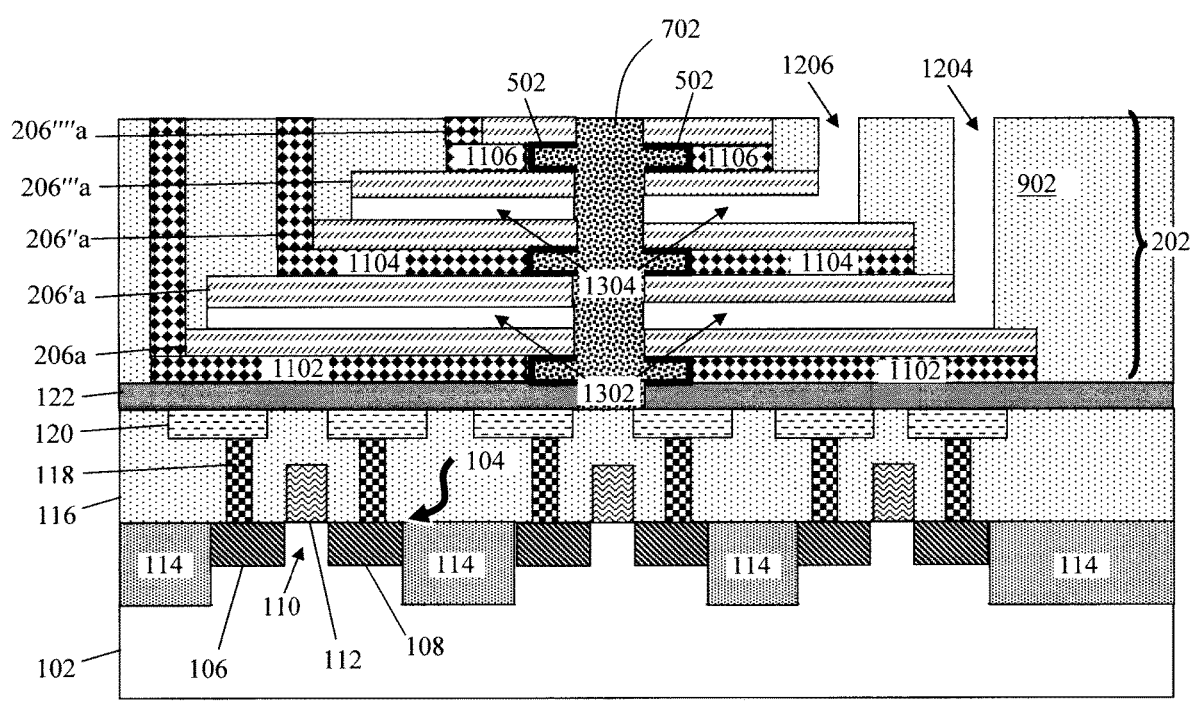
FIG. 13 is a cross-sectional diagram illustrating the sacrificial bit line layers having been removed from the memory stack via the second contact holes creating (second) gaps in the memory stack according to an embodiment of the present invention.

Sacrificial bit line layers 208a and 208'a are then removed from memory stack 202 via the contact holes 1204 and 1206, respectively. See FIG. 13. As shown in FIG. 13, removal of sacrificial bit line layers 208a and 208'a in this manner creates second gaps in memory stack 202. For instance, removal of sacrificial bit line layer 208a creates a gap 1302 between dielectric layer 206a and dielectric layer 206'a. Removal of sacrificial bit line layer 208'a creates a gap 1304 between dielectric layer 206"a and 206'"a. As provided above, the layers of memory stack 202 are continuous around the channel hole 302/channel 702. As such, accessing sacrificial bit line layers 208a and 208'a on one side of channel 702 (e.g., through the contact holes 1204 and 1206) permits complete removal of these sacrificial layers from the memory stack 202 as shown in FIG. 13. According to an exemplary embodiment, an isotropic etching process (such as a wet chemical etch) is used to remove the sacrificial bit line layers 208a and 208'a through the contact holes 1204 and 1206, respectively.

The contact holes 1204 and 1206, and gaps 1302 and 1304 are then filled with a contact metal or combination of metals to form a (first) bit line contact 1402 and a (second) bit line contact 1404. See FIG. 14. As provided above, suitable contact metals include, but are not limited to, Cu, W, Ru, Co, Ni and/or Pt. The contact metal(s) can be deposited into the contact holes 1204 and 1206, and gaps 1302 and 1304 using a process such as CVD, ALD or electrochemical plating. Prior to depositing the contact metal(s), a barrier layer (not shown) can be deposited into and lining contact holes 1204 and 1206, and gaps 1302 and 1304 to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining contact holes 1204 and 1206, and gaps 1302 and 1304 prior to contact metal deposition to facilitate plating of the contact metal(s).

Figure 14:
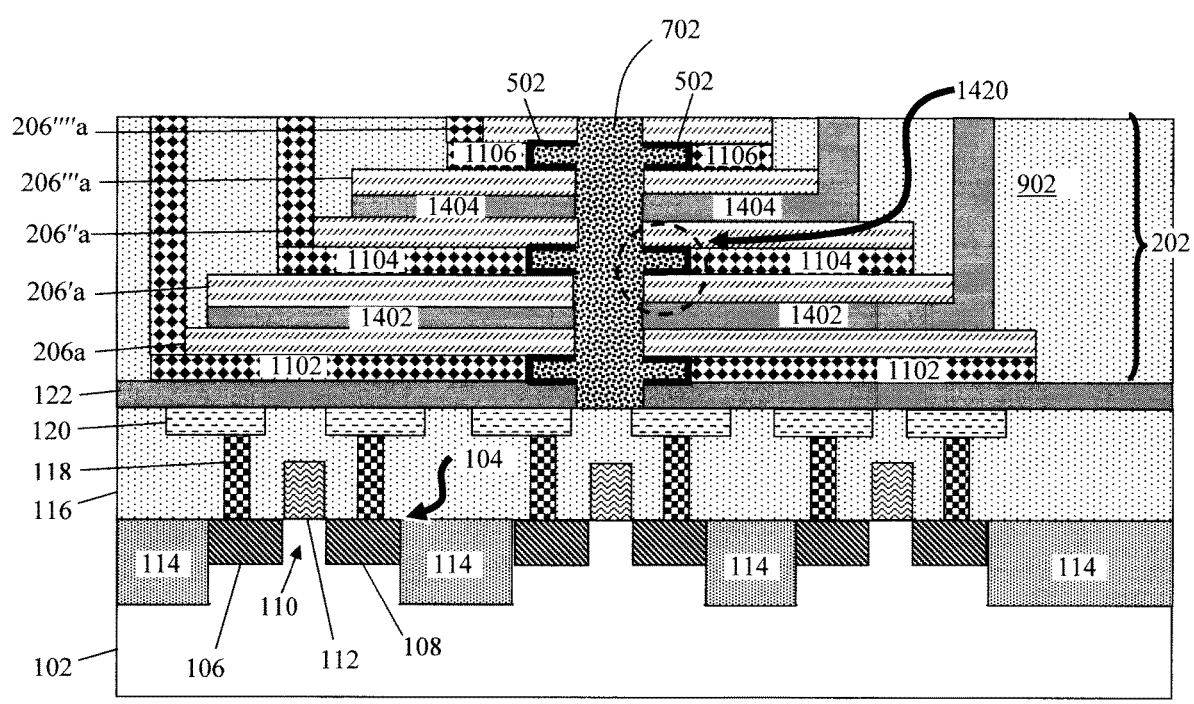
FIG. 14 is a cross-sectional diagram illustrating the second contact holes and second gaps having been filled with a contact metal(s) to form a (first) bit line contact and a (second) bit line contact according to an embodiment of the present invention.

As shown in FIG. 14, channel 702 is oriented vertically at the center of memory stack 202 which, along with the floating gate stacks 502, form floating gate transistors 1402. The word line contacts 1102, 1104 and 1106, and the bit line contacts 1402 and 1404 contact the sides of each of the floating gate transistors 1420. Thus, each floating gate transistor 1420 includes a control gate (i.e., a word line contact 1102, 1104 or 1106) separated from a floating gate 508 by a gate oxide 506 (see FIG. 5, described above) and a channel 702 separated from the floating gate 508 by a tunnel oxide 510. With the present configuration, the floating gate transistors 1420 are connected in parallel forming a NOR circuit.

Figure 15:
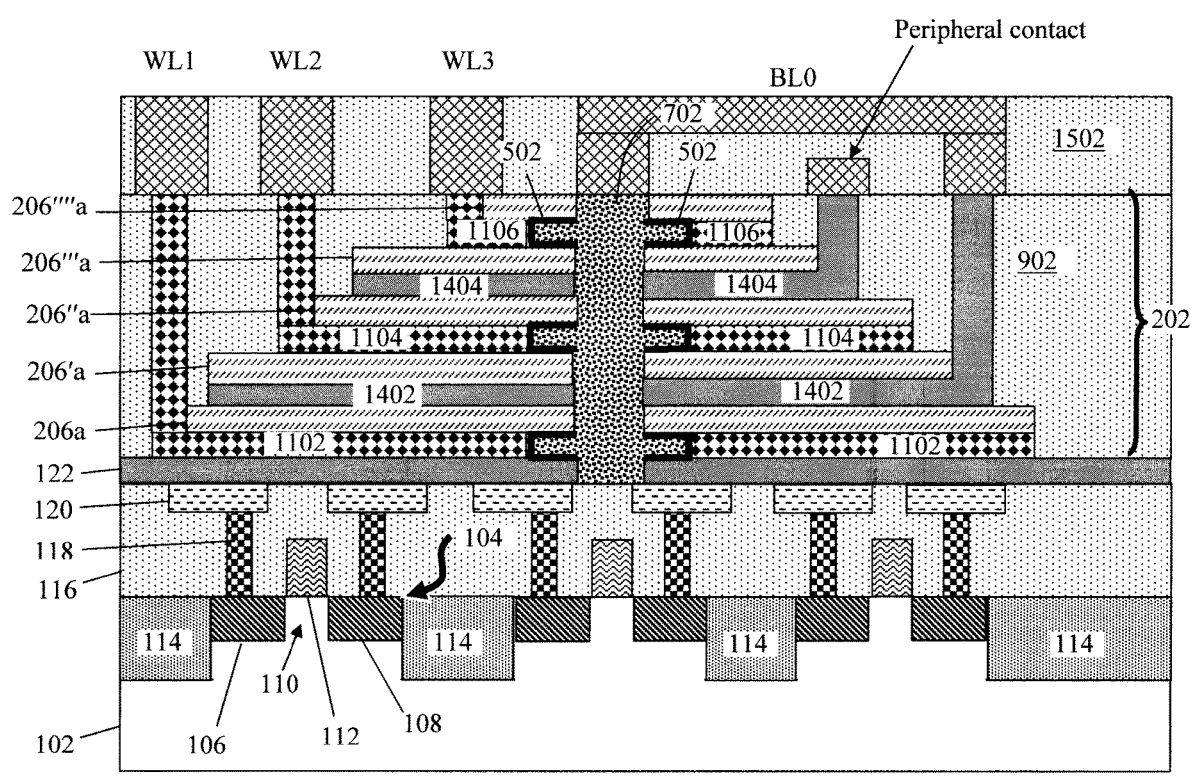
FIG. 15 is a cross-sectional diagram illustrating an exemplary configuration of the present NOR memory device for neuromorphic computing according to an embodiment of the present invention.

As provided above, the present NOR device can be implemented for applications such as neuromorphic computing. For instance, one exemplary configuration of the present NOR device for neuromorphic computing is shown in FIG. 15. As shown in FIG. 15, in this example a first word line WL1, a second word line WL2 and a third word line WL3 are formed in contact with word line contacts 1102, 1104 and 1106, respectively. A bit line BL0 is formed in contact with the channel 702 and bit line contact 1402. A peripheral circuit such as a pulse generator or current integrator is formed in contact with bit line contact 1404.

Standard metallization techniques can be employed to form the WL1, WL2, WL3, BL0 and peripheral contact. For instance, according to an exemplary embodiment, an ILD 1502 is deposited onto dielectric 902, over the memory stack 202, and planarized using a process such as CMP. As provided above, suitable ILD materials include, but are not limited to, oxide materials such as SiOx and/or SiCOH and/or ULK-ILD materials such as pSiCOH. Standard lithography and etching techniques (see above) are then employed to pattern features (e.g., vias and/or trenches) in ILD 1502 with the footprint and location of the WL1, WL2, WL3, BL0 and peripheral contact. The features are then filled with a contact metal(s) to form the WL1, WL2, WL3, BL0 and peripheral contact. As provided above, suitable contact metals include, but are not limited to, Cu, W, Ru, Co, Ni and/or Pt. The contact metal(s) can be deposited into the features using a process such as evaporation, sputtering or electrochemical plating. Prior to depositing the contact metal(s), a barrier layer (not shown) can be deposited into and lining the features to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the features prior to contact metal deposition to facilitate plating of the contact metal(s). In order to form BL0 over the peripheral contact, this process may need to be performed in multiple patterning and metallization stages.

Figure 16:
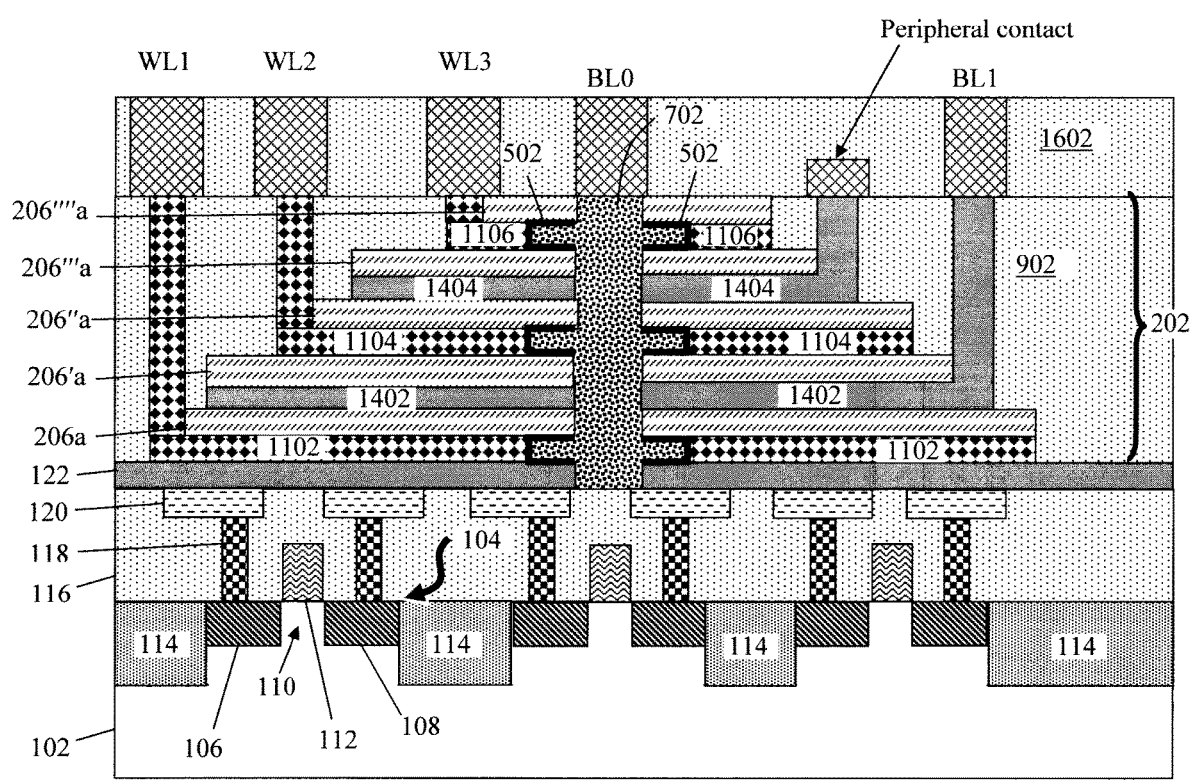
FIG. 16 is a cross-sectional diagram illustrating another exemplary configuration of the present NOR memory device for neuromorphic computing according to an embodiment of the present invention.

Another exemplary configuration of the present NOR device for neuromorphic computing is shown in FIG. 16. As in the example above, a first word line WL1, a second word line WL2 and a third word line WL3 are formed in contact with word line contacts 1102, 1104 and 1106, respectively. However, in this case separate bit lines BL0 and BL1 are formed in contact with the channel 702 and bit line contact 1402, respectively. A peripheral circuit contact is formed in contact with bit line contact 1404.

In the same manner as described above, standard metallization techniques can be employed to form the WL1, WL2, WL3, BL0, BL1 and peripheral contact. For instance, according to an exemplary embodiment, an ILD 1602 is deposited onto dielectric 902, over the memory stack 202, and planarized using a process such as CMP. As provided above, suitable ILD materials include, but are not limited to, oxide materials such as SiOx and/or SiCOH and/or ULK-ILD materials such as pSiCOH. Standard lithography and etching techniques (see above) are then employed to pattern features (e.g., vias and/or trenches) in ILD 1602 with the footprint and location of the WL1, WL2, WL3, BL0, BL1 and peripheral contact. The features are then filled with a contact metal(s) to form the WL1, WL2, WL3, BL0, BL and peripheral contact. As provided above, suitable contact metals include, but are not limited to, Cu, W, Ru, Co, Ni and/or Pt. The contact metal(s) can be deposited into the features using a process such as evaporation, sputtering or electrochemical plating. Prior to depositing the contact metal(s), a barrier layer (not shown) can be deposited into and lining the features to prevent diffusion of the contact metal(s) into the surrounding dielectric. As provided above, suitable barrier layer materials include, but are not limited to, Ru, Ta, TaN, Ti, and/or TiN. Additionally, a seed layer (not shown) can be deposited into and lining the features prior to contact metal deposition to facilitate plating of the contact metal(s).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a memory device, the method comprising the steps of:
   forming a memory stack on a wafer, wherein the memory stack comprises alternating sacrificial word line layers and sacrificial bit line layers separated by dielectric layers;
   patterning a channel hole in the memory stack;
   recessing the sacrificial word line layers through the channel hole to form divots in the sacrificial word line layers along opposite sides of the channel hole;
   selectively forming a floating gate stack in the divots;
   filling the channel hole and the divots with a channel material to form a channel;
   patterning the memory stack into a stair case structure having a largest footprint at a base of the memory stack which narrows progressively at each level up the stair case structure;
   burying the memory stack in a dielectric;
   replacing the sacrificial word line layers in the memory stack with word line contacts; and
   replacing the sacrificial bit line layers in the memory stack with bit line contacts.

2. The method of claim 1, further comprising the steps of:
   patterning first contact holes in the dielectric over each of the sacrificial word line layers;
   removing the sacrificial word line layers via the first contact holes forming first gaps in the memory stack; and
   forming the word line contacts in the first contact holes and the first gaps.

3. The method of claim 2, further comprising the steps of:
   patterning second contact holes in the dielectric over each of the sacrificial bit line layers;
   removing the sacrificial bit line layers via the second contact holes forming second gaps in the memory stack; and
   forming the bit line contacts in the second contact holes and the second gaps.

4. The method of claim 1, wherein the sacrificial word line layers comprise a material selected from the group consisting of: silicon nitride (SiN), silicon oxynitride (SiON), silicon oxycarbonitride (SiOCN), and combinations thereof.

5. The method of claim 1, wherein the sacrificial bit line layers comprise a material selected from the group consisting of: amorphous carbon, poly-silicon, silicon carbide (SiC), and combinations thereof.

6. The method of claim 1, wherein the dielectric layers comprise a material selected from the group consisting of: silicon oxide (SiOx), silicon oxycarbide (SiOC), and combinations thereof.

7. The method of claim 1, wherein the wafer comprises multiple field effect transistors (FETs), and wherein the memory device further comprises:
   a metal line on the wafer in contact with the FETs, wherein the memory stack is formed on the wafer over the metal line.

8. The method of claim 1, wherein the channel hole is patterned at a center of the memory stack.

9. The method of claim 1, wherein the floating gate stack comprises:
- a gate oxide disposed in the divots on the sacrificial word line layers;
- a floating gate disposed on the gate oxide; and
- a tunnel oxide disposed on the floating gate.

10. The method of claim 1, wherein the step of selectively forming the floating gate stack in the divots comprises the steps of:
- forming the floating gate stack lining the channel hole and the divots; and
- etching the floating gate stack to remove the floating gate stack from sidewalls of the channel hole such that only the floating gate stack lining the divots remains.

11. The method of claim 1, wherein the channel material comprises poly-silicon.

12. The method of claim 1, wherein the memory stack comprises at least a first sacrificial word line layer, a second sacrificial word line layer, and a third sacrificial word line layer, and at least a first sacrificial bit line layer and a second sacrificial bit line layer.

13. The method of claim 1, wherein the word line contacts comprise at least a first word line contact, a second word line contact, and a third word line contact, and wherein the bit line contacts comprise at least a first bit line contact and a second bit line contact.

14. The method of claim 13, further comprising the steps of:
- depositing an interlayer dielectric (ILD) over the memory stack;
- forming a first word line WL1 in the ILD in contact with the first word line contact;
- forming a second word line WL2 in the ILD in contact with the second word line contact;
- forming a third word line WL3 in the ILD in contact with the third word line contact; and
- forming a bit line BL0 in the ILD in contact with the channel and the first bit line contact.

15. The method of claim 13, further comprising the steps of:
- depositing an ILD over the memory stack;
- forming a first word line WL1 in the ILD in contact with the first word line contact;
- forming a second word line WL2 in the ILD in contact with the second word line contact;
- forming a third word line WL3 in the ILD in contact with the third word line contact;
- forming a first bit line BL0 in the ILD in contact with the channel; and
- forming a second bit line BL1 in contact with the first bit line contact.

16. A method of forming a memory device, the method comprising the steps of:
- forming a memory stack on a wafer, wherein the memory stack comprises alternating sacrificial word line layers and sacrificial bit line layers separated by dielectric layers;
- patterning a channel hole in the memory stack;
- recessing the sacrificial word line layers through the channel hole to form divots in the sacrificial word line layers along opposite sides of the channel hole;
- selectively forming a floating gate stack in the divots;
- filling the channel hole and the divots with a channel material to form a channel;
- patterning the memory stack into a stair case structure having a largest footprint at a base of the memory stack which narrows progressively at each level up the stair case structure;
- burying the memory stack in a dielectric;
- patterning first contact holes in the dielectric over each of the sacrificial word line layers;
- removing the sacrificial word line layers via the first contact holes forming first gaps in the memory stack;
- forming word line contacts in the first contact holes and the first gaps;
- patterning second contact holes in the dielectric over each of the sacrificial bit line layers;
- removing the sacrificial bit line layers via the second contact holes forming second gaps in the memory stack; and
- forming bit line contacts in the second contact holes and the second gaps.

17. A memory device, comprising:
- a wafer;
- a memory stack disposed on the wafer, wherein the memory stack comprises alternating word line contacts and bit line contacts separated by dielectric layers, and wherein the memory stack has a stair case structure having a largest footprint at a base of the memory stack which narrows progressively at each level up the stair case structure;
- a channel hole in the memory stack;
- divots in the word line contacts along opposite sides of the channel hole;
- a floating gate stack lining the divots;
- a channel comprising a channel material disposed into, and filling, the channel hole and the divots; and
- a dielectric surrounding the memory stack.

18. The memory device of claim 17, wherein the word line contacts comprise at least a first word line contact, a second word line contact, and a third word line contact, and wherein the bit line contacts comprise at least a first bit line contact and a second bit line contact.

19. The memory device of claim 18, further comprising:
- an ILD disposed over the memory stack;
- a first word line WL1 in the ILD in contact with the first word line contact;
- a second word line WL2 in the ILD in contact with the second word line contact;
- a third word line WL3 in the ILD in contact with the third word line contact; and
- a bit line BL0 in the ILD in contact with the channel and the first bit line contact.

20. The memory device of claim 18, further comprising:
- an ILD disposed over the memory stack;
- a first word line WL1 in the ILD in contact with the first word line contact;
- a second word line WL2 in the ILD in contact with the second word line contact;
- a third word line WL3 in the ILD in contact with the third word line contact;
- a first bit line BL0 in the ILD in contact with the channel; and
- a second bit line BL1 in contact with the first bit line contact.

* * * * *